(12) United States Patent
Suzuki

(10) Patent No.: US 7,184,117 B2
(45) Date of Patent: Feb. 27, 2007

(54) DISPLAY PANEL HAVING NOISE SHIELDING STRUCTURE

(75) Inventor: Isamu Suzuki, Kariya (JP)

(73) Assignee: Denso Corporation, Kariya (JP)

( * ) Notice: Subject to any disclaimer, the term of this patent is extended or adjusted under 35 U.S.C. 154(b) by 172 days.

(21) Appl. No.: 10/878,397

(22) Filed: Jun. 29, 2004

(65) Prior Publication Data

US 2005/0024573 A1 Feb. 3, 2005

(30) Foreign Application Priority Data

Jul. 31, 2003 (JP) ............................. 2003-284092

(51) Int. Cl.
G02F 1/1345 (2006.01)
G02F 1/1333 (2006.01)
(52) U.S. Cl. .................. 349/150; 349/58; 349/149
(58) Field of Classification Search ........ 349/149–152, 349/58
See application file for complete search history.

(56) References Cited

U.S. PATENT DOCUMENTS

| | | | | |
|---|---|---|---|---|
| 4,663,670 | A | 5/1987 | Ito et al. ..................... | 348/794 |
| 2002/0088629 | A1 | 7/2002 | Jeon ............................ | 174/35 |
| 2004/0114062 | A1 | 6/2004 | Nishio et al. ................. | 349/58 |

FOREIGN PATENT DOCUMENTS

| | | |
|---|---|---|
| EP | 1 387 334 | 2/2004 |
| GB | 2 152 761 | 8/1985 |
| GB | 2 339 052 | 1/2000 |
| JP | A-5-45626 | 2/1993 |
| JP | A-7-92450 | 4/1995 |
| JP | A-9-138389 | 5/1997 |
| JP | A-10-143083 | 5/1998 |
| JP | A-10-244054 | 9/1998 |
| JP | A-10-268272 | 10/1998 |
| JP | A-2002-91327 | 3/2002 |
| WO | WO 02/091340 | 11/2002 |

OTHER PUBLICATIONS

*Notice of Preliminary Rejection* (an English translation), Korean Intellectual Property Office in corresponding Application S/N:10-2004-0060371, Feb. 24, 2006.
First Office Action from Chinese Patent Office issued on Jul. 14, 2006 for the corresponding Chinese patent application No. 200410058801 (a copy and English translation thereof).

*Primary Examiner*—Dung T. Nguyen
(74) *Attorney, Agent, or Firm*—Posz Law Group, PLC

(57) ABSTRACT

A circuit board area is formed on a front glass substrate of a liquid crystal display (LCD) panel, and driver ICs are mounted in the circuit board section. The driver ICs are electrically connected to an external display control device via a flexible printed circuit board (FPC). A metal foil is attached to one side of the FPC for shielding unnecessary radiating noises. The metal foil has connecting flap portions and the flap portions are fixed to an outer case of a backlight unit with a metal foil tape. The metal foil tape is also bonded to an external frame of an LCD device. As a result, the metal foil is electrically connected with the external frame and the radiating noises are effectively reduced.

14 Claims, 8 Drawing Sheets

DISPLAY PANEL HAVING NOISE SHIELDING STRUCTURE

CROSS REFERENCE TO RELATED APPLICATION

This application is based on and incorporates herein by reference Japanese Patent Application No. 2003-284092 filed on Jul. 31, 2003.

FIELD OF THE INVENTION

The present invention relates to a display panel having a noise shielding structure.

BACKGROUND OF THE INVENTION

A liquid crystal display (LCD) used in a vehicle for displaying a map for. vehicle navigation or a television program. The LCD includes an LCD panel, a backlight unit, and an external frame as main components. The external frame houses the LCD panel and the backlight unit. The LCD panel is constructed of two transparent plates and liquid crystal that is filled between the transparent plates. In recent years, glass substrates are used for the transparent plates. Circuit patterns are formed on the glass substrate outside a display area by print wiring means. A driver IC for the LCD panel is mounted in the circuit pattern formed area. In such a display, the circuit patterns on the glass substrate are connected to an external display control device via a flexible printed circuit board (FPC).

Because high-frequency control signals are inputted to the LCD panel, unnecessary radiating noises (electromagnetic waves) are produced. Display devices having structures for reducing such unnecessary radiating noises are proposed in JP-A-7-92450, JP-A-10-244054, and JP-A-2002-91327. In JP- A-7-92450, the LCD device has a source circuit board and a gate circuit board around a crystal display panel. The liquid crystal display panel is housed inside a metal external frame. A ferrite is arranged the periphery of the liquid crystal display panel and sandwiched between the liquid crystal display panel and the external frame. As a result, unnecessary radiating noises produced in the source circuit board and the gate circuit board do not leak outside.

In JP-A-10-244054, a transparent shield member is arranged on a back surface of a liquid crystal display panel to reduce unnecessary radiating noises produced in the liquid crystal display panel leak outside.

In JP-A-2002-91327, a liquid crystal display device is configured that a liquid crystal display panel and a backlight unit housed in an external frame. A transparent electrode is formed on an entire top surface of a polarizer of the liquid crystal panel. An entire display surface of the liquid crystal display panel is shielded from electromagnetic waves by connecting the transparent electrode with a printed circuit board arranged on a back side of the crystal display panel.

When a circuit pattern on the glass substrate is connected with an external display control device via a FPC, high frequency control signals pass through the FPC. Therefore, unnecessary radiating noises are produced from the FPC. The liquid crystal display device for a vehicle is arranged around a radio turner or a television tuner. Thus, problems including noises in radio sound or television picture distortion are caused by the radiating noises produced from the liquid crystal display device.

A ground is provided in the flexible printed board for connecting to a ground of the display control device. However, this provides little effect on reduction of the unnecessary radiating noises. Therefore, the FPC is covered with a shielding layer and the shielding layer. is connected. to the ground of the display control device via the ground of the FPC.

However, a method including covering the FPC with the shielding layer still provides little effect on shielding of the unnecessary radiating noises. This is because the ground is unstable. If the ground has a large area, it will be stable. However, the ground of the FPC is formed in a line. Namely, the ground does not have a large area for properly reducing electrical charge produced in the shielding layer. As a result, the unnecessary radiating noises are not effectively reduced.

SUMMARY OF THE INVENTION

The present invention therefore has an objective to provide a display device having a noise shielding structure that effectively shields unnecessary radiating noises. A display device of the present invention has a display panel and a metal external frame that houses the display panel. A connecting member is provided for connecting the display panel to an external device. Since this connecting member may produce unnecessary radiating noises, a shielding layer is formed on the connecting member for reducing the radiating noises. The shielding layer is electrically connected with the external frame. Because the external frame has a large surface area, it works as a stable ground and the radiating noises are effectively reduced.

The display panel is constructed of two transparent plates and liquid crystal that is filled between the transparent plates. At least one of the two transparent plates is a glass substrate and a circuit board area is formed on the glass substrate for mounting electronic components. Because the circuit board area integrally is formed wit the glass substrate and the electronic components are mounted in the area, wiring for display panel control can be simplified.

The connecting member is a flexible printed circuit board and the shielding layer is formed on at least one of the first and the second sides. With this structure, the connecting member is easily shielded. To provide the shielding at low cost, the shielding layer is formed with a metal foil.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
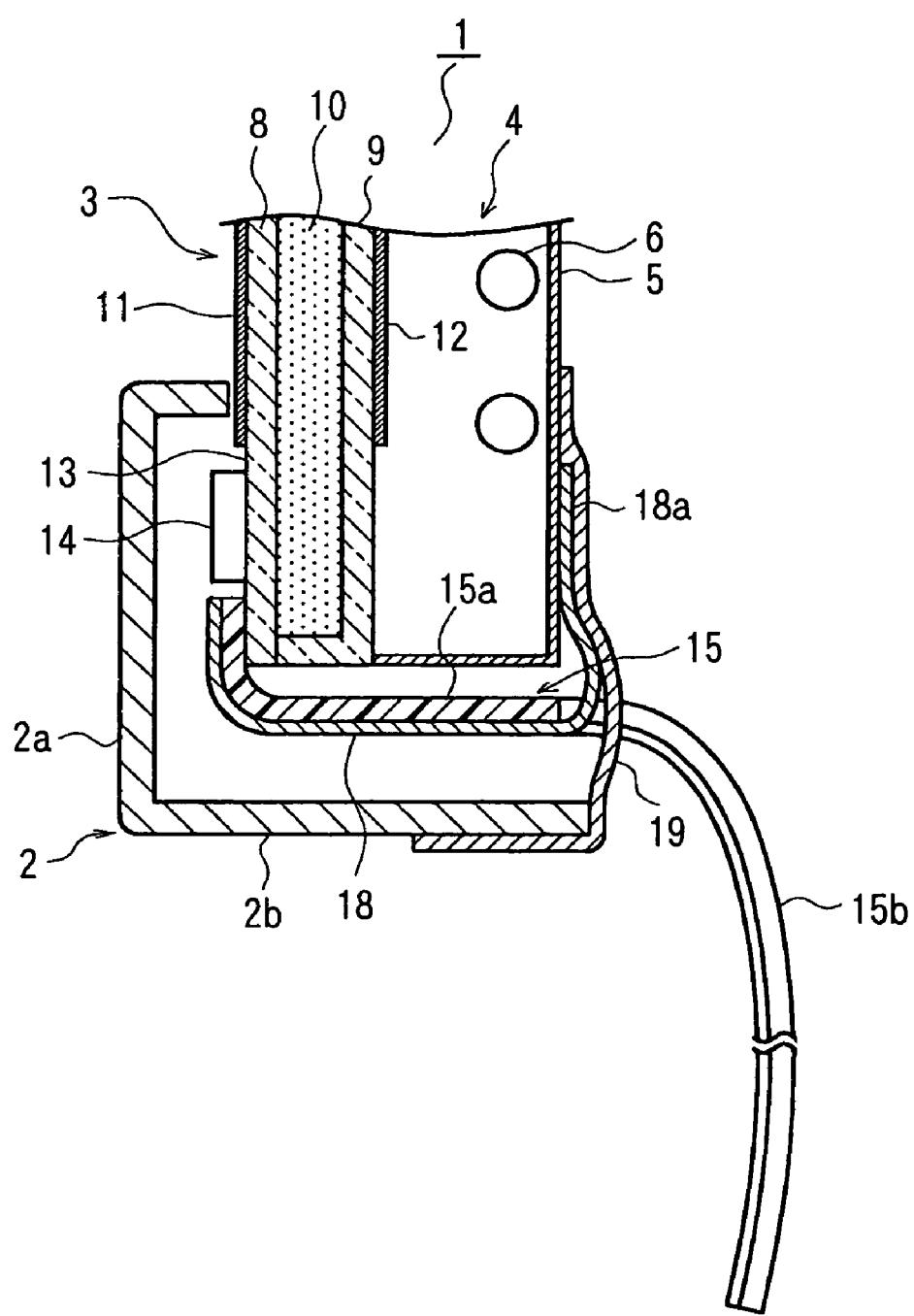
FIG. 1 .is a cross sectional view of a relevant part of a display device according to the first embodiment of the present invention.

The preferred embodiments of the present invention will be explained with reference to the accompanying drawings. In the drawings, the same numerals are used for the same components and devices.

[First Embodiment]

Figure 2:
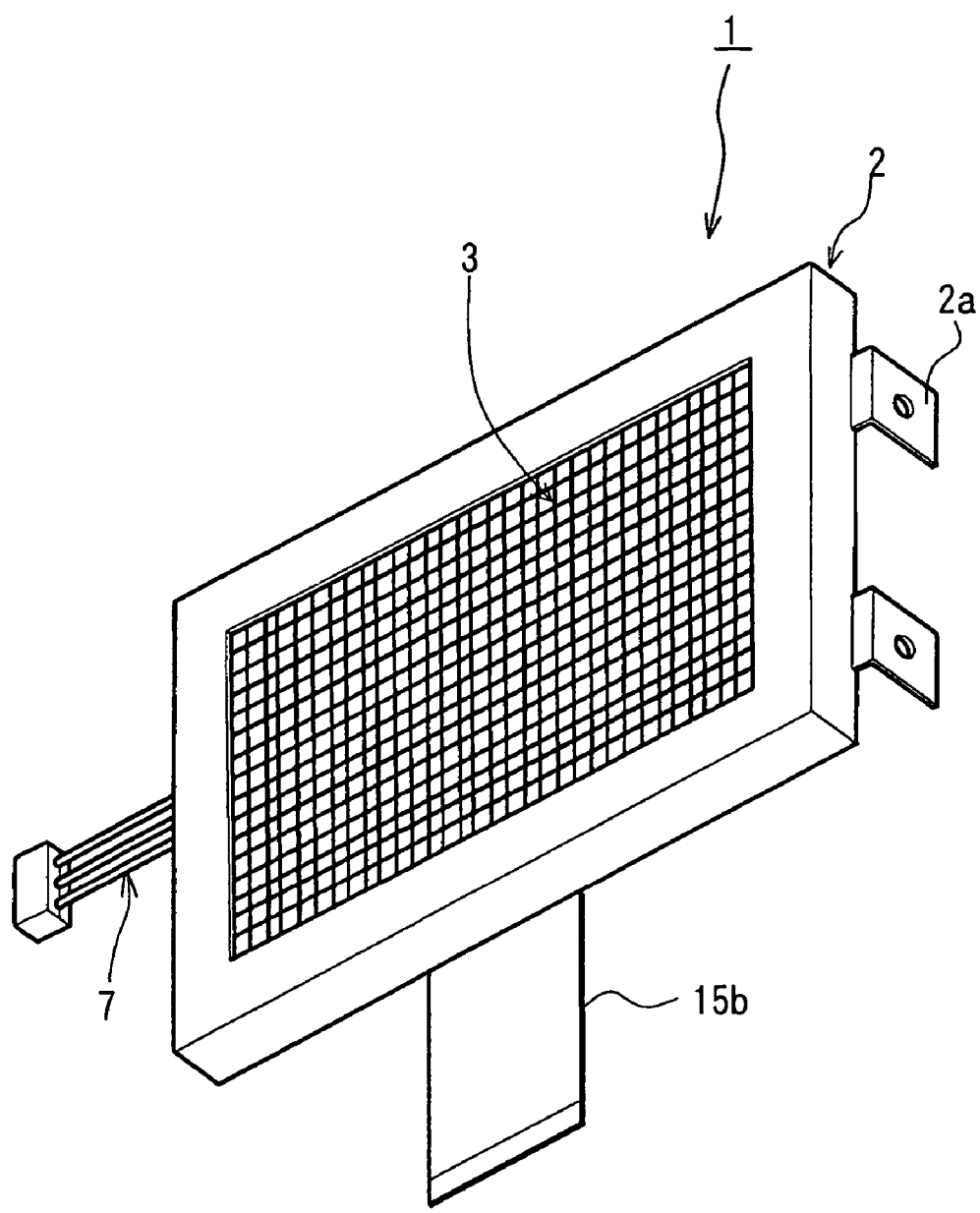
FIG. 2 is a perspective view of an LCD panel according to the first embodiment.
Figure 3:
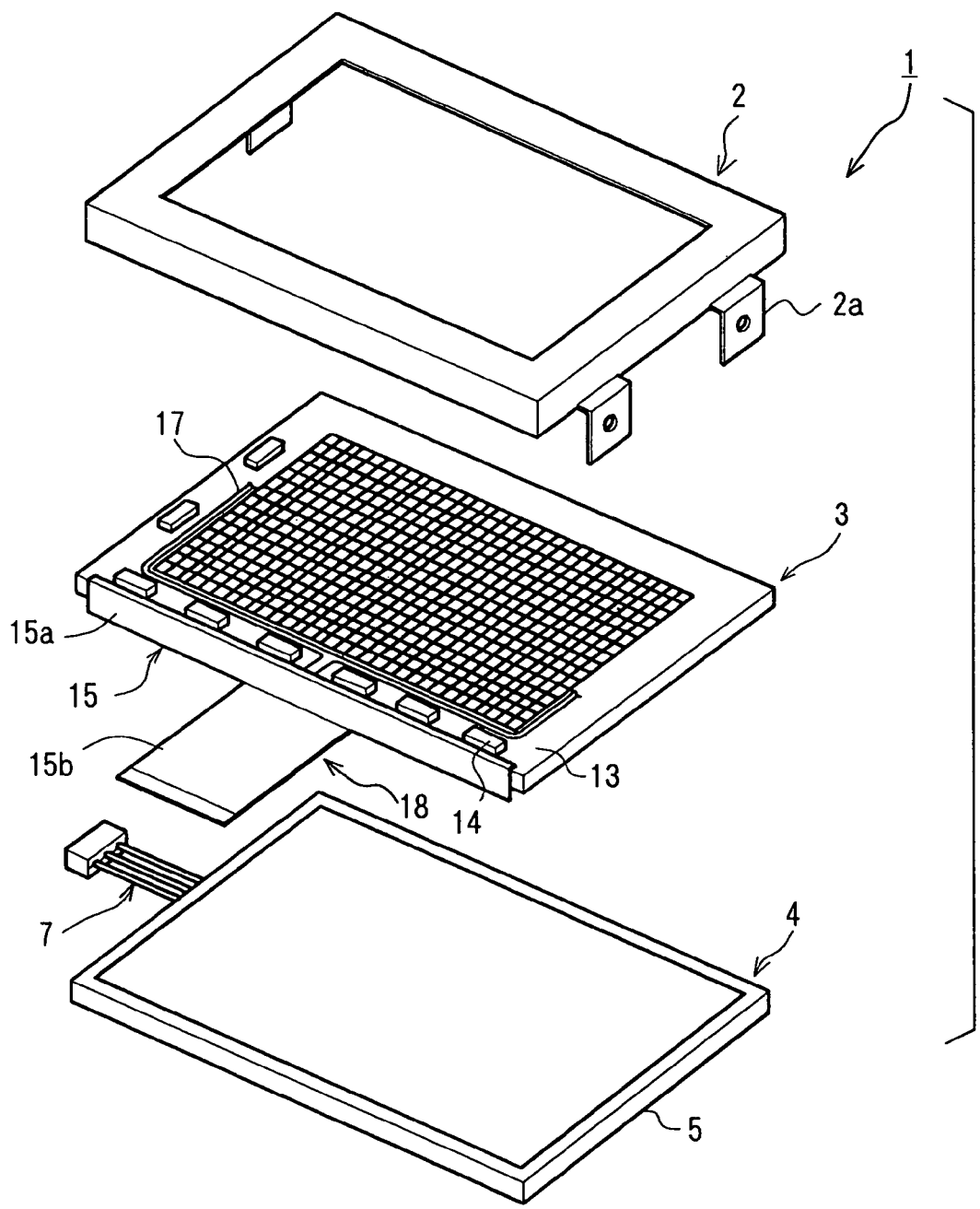
FIG. 3 is an exploded view of the LCD panel according to the first embodiment.

Referring to FIGS. 1 through 3, a liquid crystal display (LCD) device 1 is constructed of an external frame 2, an LCD panel 3 and a backlight unit 4. The LCD panel 3 and the backlight unit 4 are arranged in layers and housed in the external frame 2 made of a metal plate, such as a steel plate. The backlight unit 4 having a light source 6 in an outer case 5 is positioned at a posterior part of the external frame 2. A cable 7 for connecting the light source 6 to a power source is extended from the backlight unit 4.

The LCD panel 3 is constructed by filling liquid crystal 10 between first and second glass substrates 8, 9 and positioned at an anterior part of the inside space of the external frame 2. The first glass substrate 8 is located in the front while the second substrate 9 is located in the rear. Deflecting plates 11, 12 are arranged in display areas of a front surface of the first glass substrate 8 and a rear surface of the second glass substrate 9, respectively. The display areas are indicated in mesh patterns in FIGS. 2 and 3. The deflecting plate 11 is attached to the font surface and the deflecting plate 12 is attached to the rear surface.

A perimeter of the front surface of the first glass substrate 8, that is, a portion of the first glass substrate 8 around the display area is configured as a circuit board area 13. Circuit patterns (not shown) are formed in the circuit board area 13. Driver ICs 14, which are electronic. components for driving the LCD panel, are mounted in the circuit board area 13. Since the circuit board area 13 is integrally formed wit the glass substrate 8 and the driver ICs 14 are mounted in the area, wiring for display panel control can be simplified.

Figure 4:
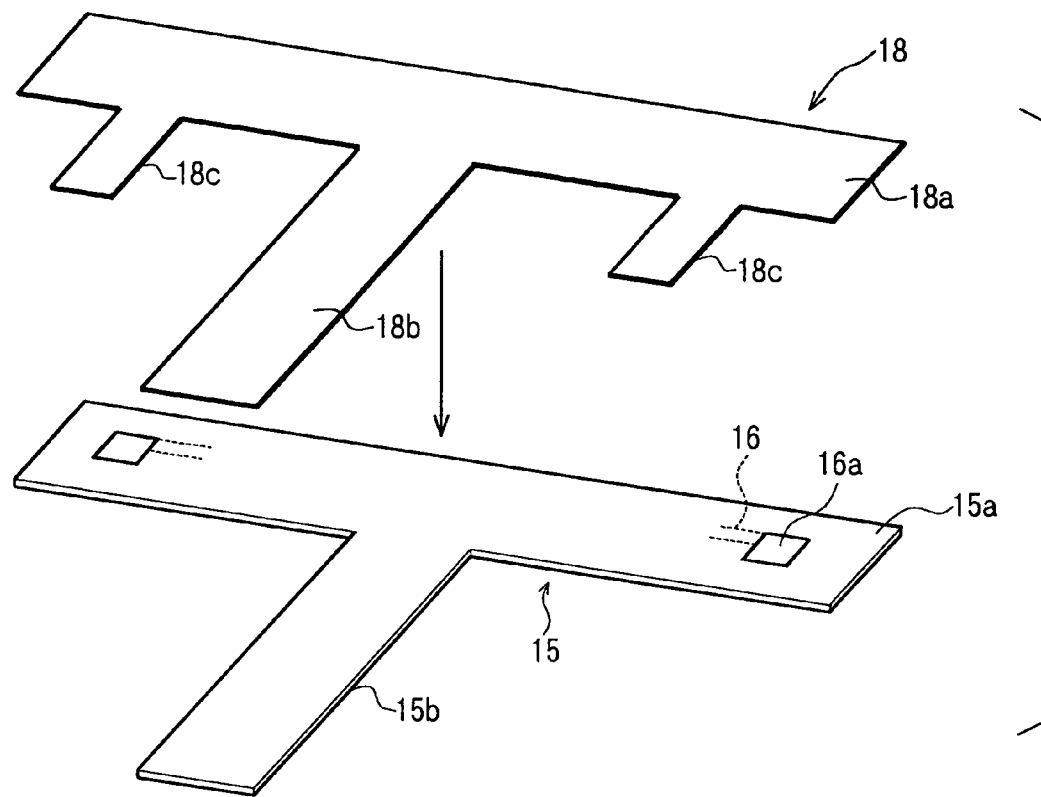
FIG. 4 is perspective views of an FPC and a metal foil for shielding according to the first embodiment.

Referring to FIG. 4, an FPC 15 is connected with a bottom end of the first glass substrate 8 in the lower circuit board area 13 by soldering. The FPC 15 is a connecting member for making a connection between the driver ICs 14 and an external display control device (not shown). It is a multi-layered circuit board formed by laminating multiple plastic film printed circuit boards. An end of the. FPC is connected to the display control device.

The FPC 15 has a substrate connecting portion 15a and an external device connecting portion 15b. The substrate connection portion 15a and the external device connecting portion 15b are connected to the circuit board area 13 and the display control device, respectively.

The external device connecting portion 15b extends from the center of the circuit board connecting portion 15a. An overall shape of the FPC 15 looks a letter T. The FPC 15 includes a number of lead line patterns (not shown) for making connections between the circuit patterns in the circuit board area 13 and the display control device. The FPC 15 has first and second sides and a ground 16 is formed on the first side. The ground 16 is connected to a ground 17 provided in the circuit board area 13.

The external frame 2 has a front portion 2a and a bottom portion 2b that lie along the front surface and the bottom surface of the LCD panel 3, respectively. The FPC 15 is bent so that its end forms substantially an L-shape. The end of the FPC 15 is placed along inner surfaces of the front portion 2a and the bottom portion 2b. The other end of the FPC 15, that is, the external device connecting portion 15b, comes out of the external frame 2.

High frequency control signals pass through lead wire patterns (signal lines) of the FPC 15. As a result, unnecessary radiant noises are produced from the FPC 15. To shield such radiant noises, a metal foil 18 is bonded to the first side of the FPC 15 and a shielding layer is formed. The metal foil 18 may be boned to the second surface of the FPC 15.

The metal foil 18 is an aluminum foil or a copper foil and preferable to have a thickness of 1 to 500 μm. It is constructed of a base portion 18a, a stem portion 18b, and connecting flap portions 18c. The stem portion 18b perpendicularly extends from the base portion 18a so that they form a letter T to cover the FPC 15. The. connecting flap portions 18c also extends from the base portion 18a. They are located on both sides of the stem portion 18b, one on each side, approximately at the same distance from the stem portion 18b.

An adhesive for bonding the metal foil 18 to the FPC 15 is an electrically conductive adhesive. Both first and second sides of the FPC 15 are covered with electrical insulating coating, except for a land 16a of the ground 16. The metal foil 18 is electrically connected with the ground 16 when the metal foil 18 is bonded to the FPC 15.

After the LCD panel 3 and the backlight unit 4 are inserted in the external frame 2, the connecting flaps 18c are bent so that they face a rear surface of the outer case 5. The connecting flap portions 18c are fixed to the rear surface of the outer case 5 with a self-adhesive metal foil tape 19. One of ends of the metal foil tape 19 is stuck to the rear surface of the outer case 5, holding the connecting flap portions 18c. The other end is stuck to the external frame 2. An electrically conductive adhesive is provided on one of the sides of the metal foil tape 19.

With the above-described assembly, the metal foil 18 is electrically connected with the external frame 2. By connecting the external device connecting portion 15b to the display control device, the ground 16 is connected to the ground of the display control device. As a result, the metal foil 18 is also connected to the ground of the display control device.

An electric charge storing capacity of the external frame 2 is considerably large because the external frame 2 is relatively large, namely, its surface area is large. When high frequency control signals pass through a signal line of the FPC 15 and unnecessary radiant noises are produced, the radiant noises are absorbed by the metal foil 18. As a result, electrical charge is accumulated in the metal foil 18. Then, the electrical charge in the metal foil 18 is immediately transferred to the external frame 2. Since the electric charge storing capacity of the external frame 2 is large, variations in electric potential soon disappear. Namely., the radiating noises produced in the FPC 15 are shielded by the metal foil 18, and leakage of the radiating noises to the outside is effectively reduced.

Figure 5:
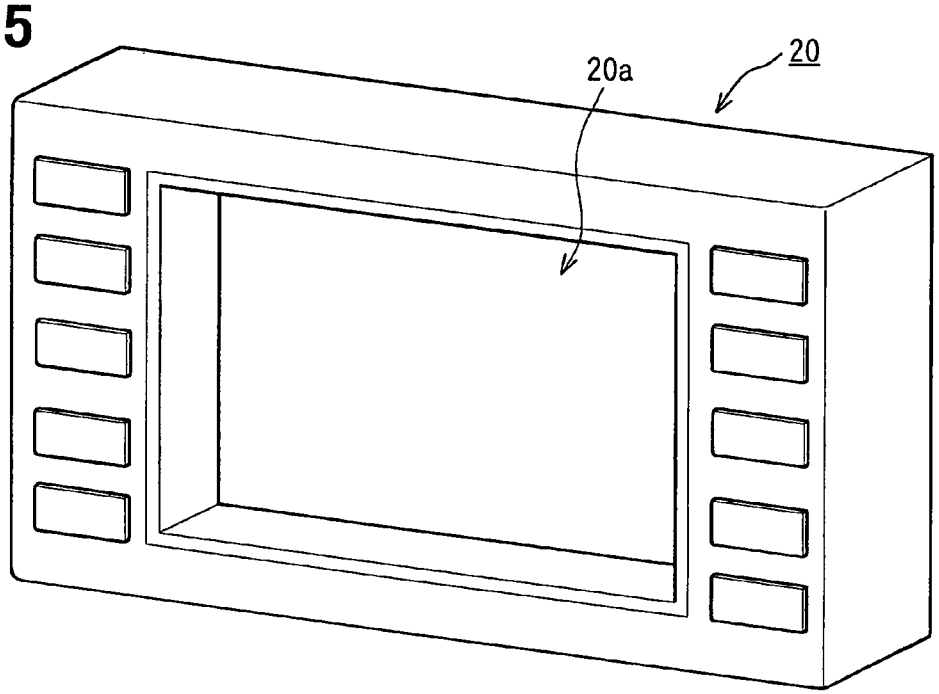
FIG. 5 is a perspective view of a main body of an onboard device according to the first embodiment.

Furthermore, the LCD device 1 is inserted in a display holding portion 20a of a main body 20 of the onboard device shown in FIG. 5. The ground of the display control device is electrically connected with the display holding portion 20a. The display holding portion 20a is made of a metal, such as aluminum die casting. Mounting flaps 2a of the external frame 2 are fixed to the display holding portion 20a with metal screws (not shown) to mount the LCD device 1 to the main body 2.

When the mounting flaps 2a are fixed to the display holding portion 20a, the external frame 2 and the metal foil 18 are electrically connected with the display holding portion 20a. Since the display holding portion 20a has a larger electric charge storing capacity than the external frame 2 and the metal foil 18, the radiant noises are more effectively reduced.

Figure 6A:
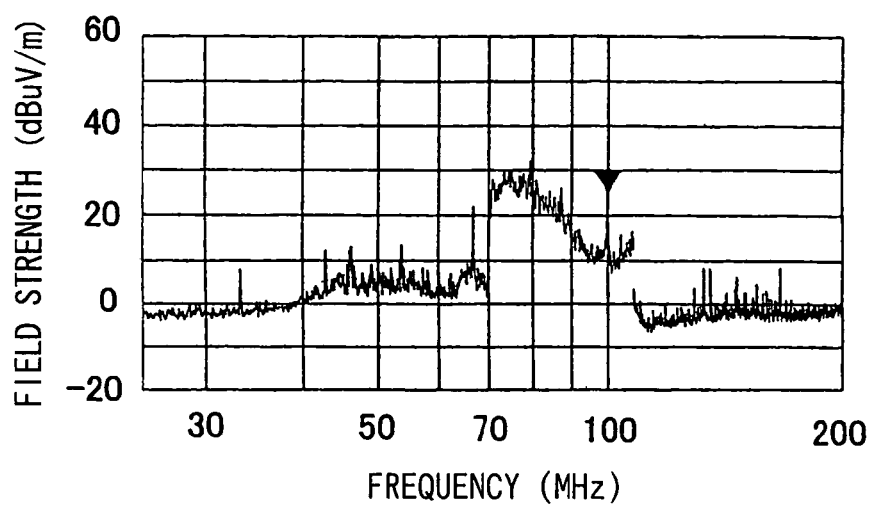
FIG. 6A is a graph showing results of measurements for examining shielding effect according to a related art.
Figure 6B:
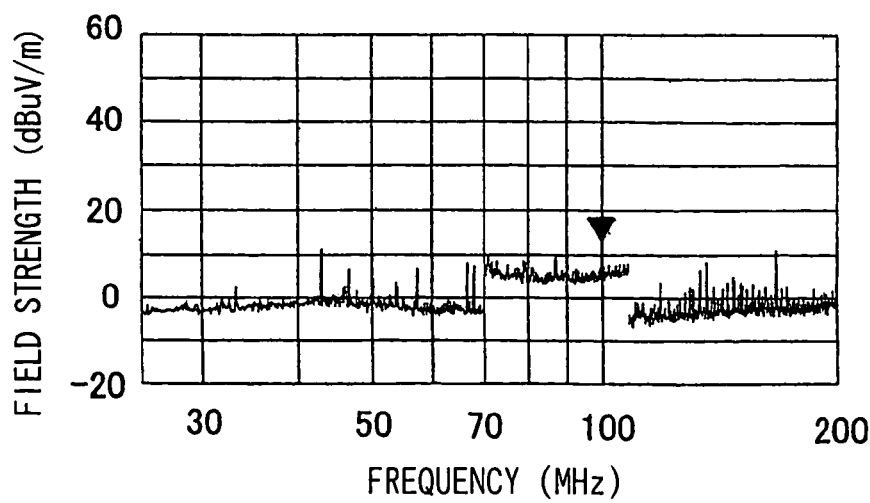
FIG. 6B is a graph showing results of measurements for examining shielding effect according to the first embodiment.

Electric field strength around the FPC 15 is measured while frequencies of signals passed through the FPC 15 are varied in regard to the LCD device 1 and an existing device. The results of the measurements regarding the LCD device 1 and the existing device are shown in FIGS. 6A and 6B, respectively. The results indicate that the radiant noises are further reduced in the LCD device 1 in comparison to the existing device.

For instance, the field strength of the LCD device is 113 dBµV/m at the frequency of 99 MHz while that of the existing device is 26 dBµV/m, namely, more than 10 dBµV/m is reduced. Especially, the radiant noises are largely reduced in a range of 70 to 108 MHz, which is a frequency range of FM broadcasting.

High frequency signals of about 33 MHz pass through the FPC 15. Devices including a vehicle navigation unit, a radio tuner, and a television tuner are arranged inside or on a periphery of the main body 20. The high frequency signals of about 99 MHz, which is three times higher than the control signal and indicated with a black triangle in FIG. 6A, causes interference with the frequency range of FM broadcasting. However, the LCD device 1 provides a large effect on FM radio noise reduction because the radiant noise is largely reduced in the range of 70 to 108 MHz.

In the LCD device 1 used in the measurements, both surfaces of the FPC 15 are covered with the metal foil 18. However, approximately the same shielding effect is confirmed by another measurement when only one surface of the FPC 15 is covered with the metal foil 18.

[Second Embodiment]

Figure 7:
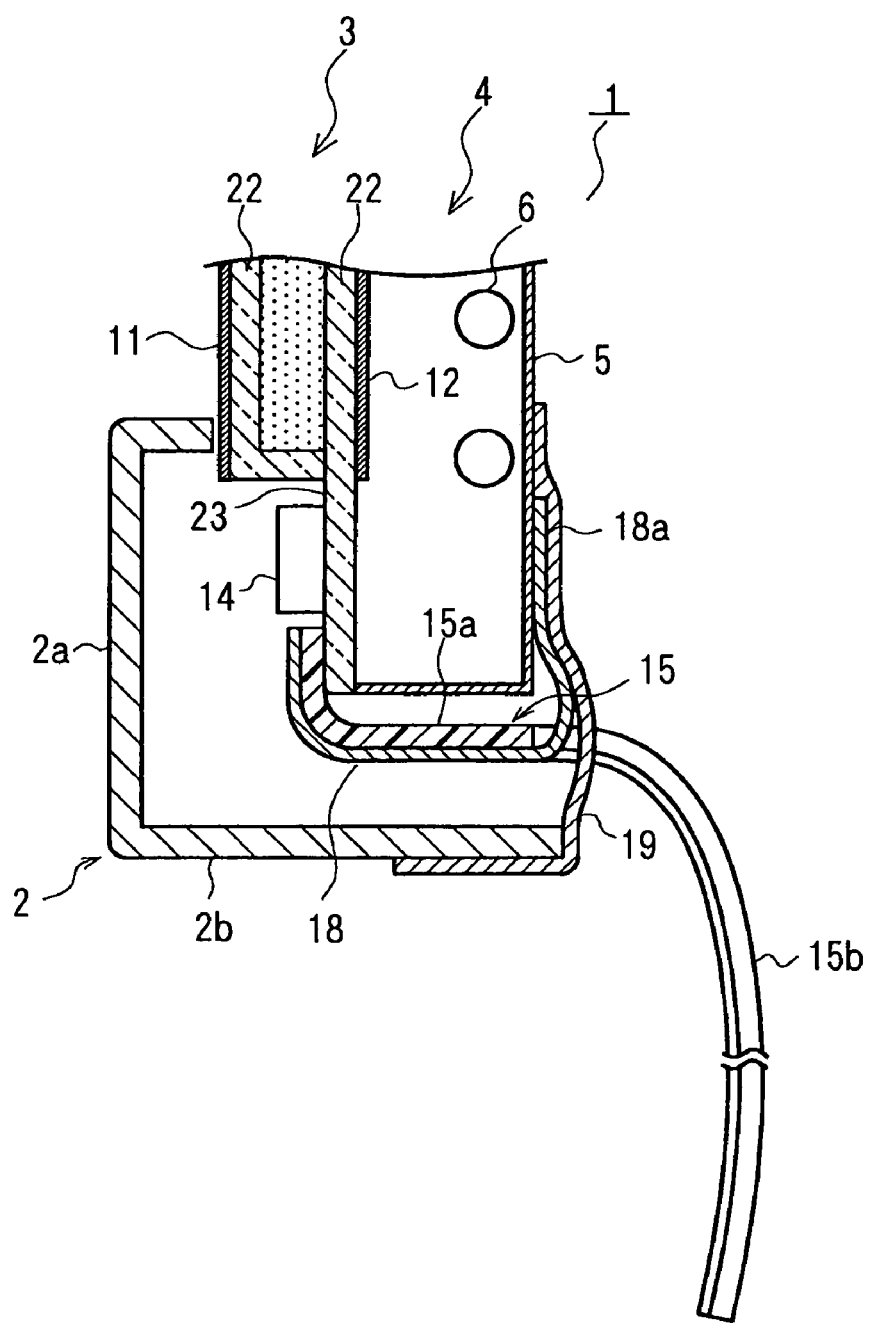
FIG. 7 is a cross sectional view of a relevant part of a display device according to the second embodiment of the present invention.

Referring to FIG. 7, the LCD panel 3 has two different sizes of transparent plates 21, 22, one of which is a glass substrate 22. Other components of the LCD device 1 are the same as the first embodiment and assembled in the same manner as the first embodiment. The first glass substrate 21 located in the front is smaller than the second glass substrate 22 located in the rear. An outer area of the second glass substrate 22 around its display area is not covered by the first glass substrate 21, namely, exposed to the outside. This outer area is referred to as a circuit board area 23. Circuit patterns (not shown) are formed in the circuit board area 23 on the front surface of the second glass substrate 22 and the driver ICs 14 are mounted.

The FPC 15 is prepared in the same manner as the first embodiment and connected with the second glass substrate 22. With this configuration, the radiating noises are effectively reduced as discussed in the first embodiment section.

[Third Embodiment]

Figure 8:
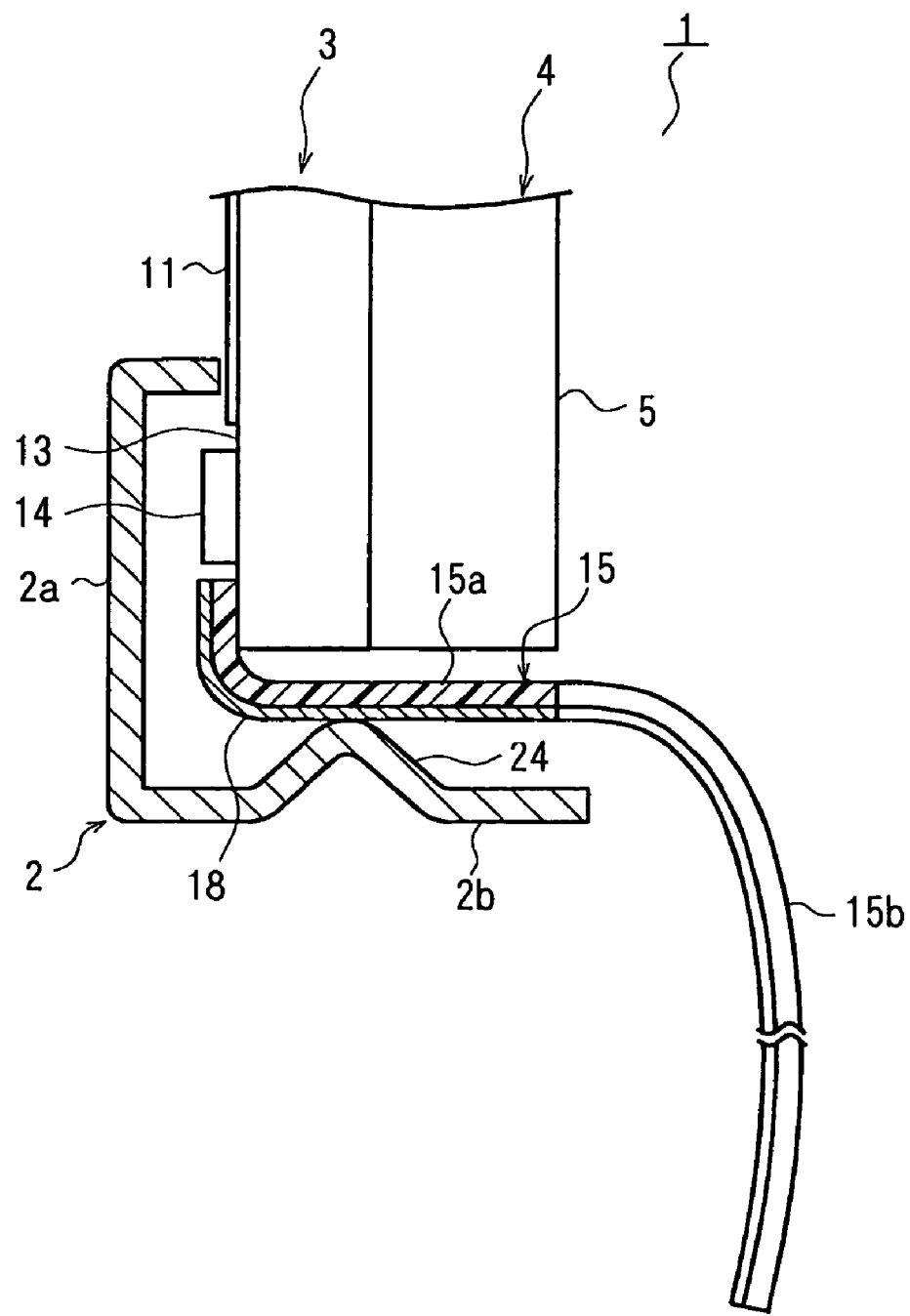
FIG. 8 is a cross sectional view of a relevant part of a display device according to the third embodiment of the present invention.

Referring to FIG. 8, an external frame 200 houses the LCD panel 3 and the backlight unit 4. It has a bump portion 24 that inwardly protrudes from a bottom portion 2b. The FPC 15 is prepared and connected with the LCD panel 3 in the same manner as the first embodiment. The bump portion 24 is brought into contact with or bonded to the metal foil 18. As a result, the metal foil 18 is electrically connected with the external frame 200. Since the metal foil 18 is electrically connected with the external frame 200, the radiating noises are effectively reduced as discussed in the first embodiment section.

[Fourth Embodiment]

Figure 9:
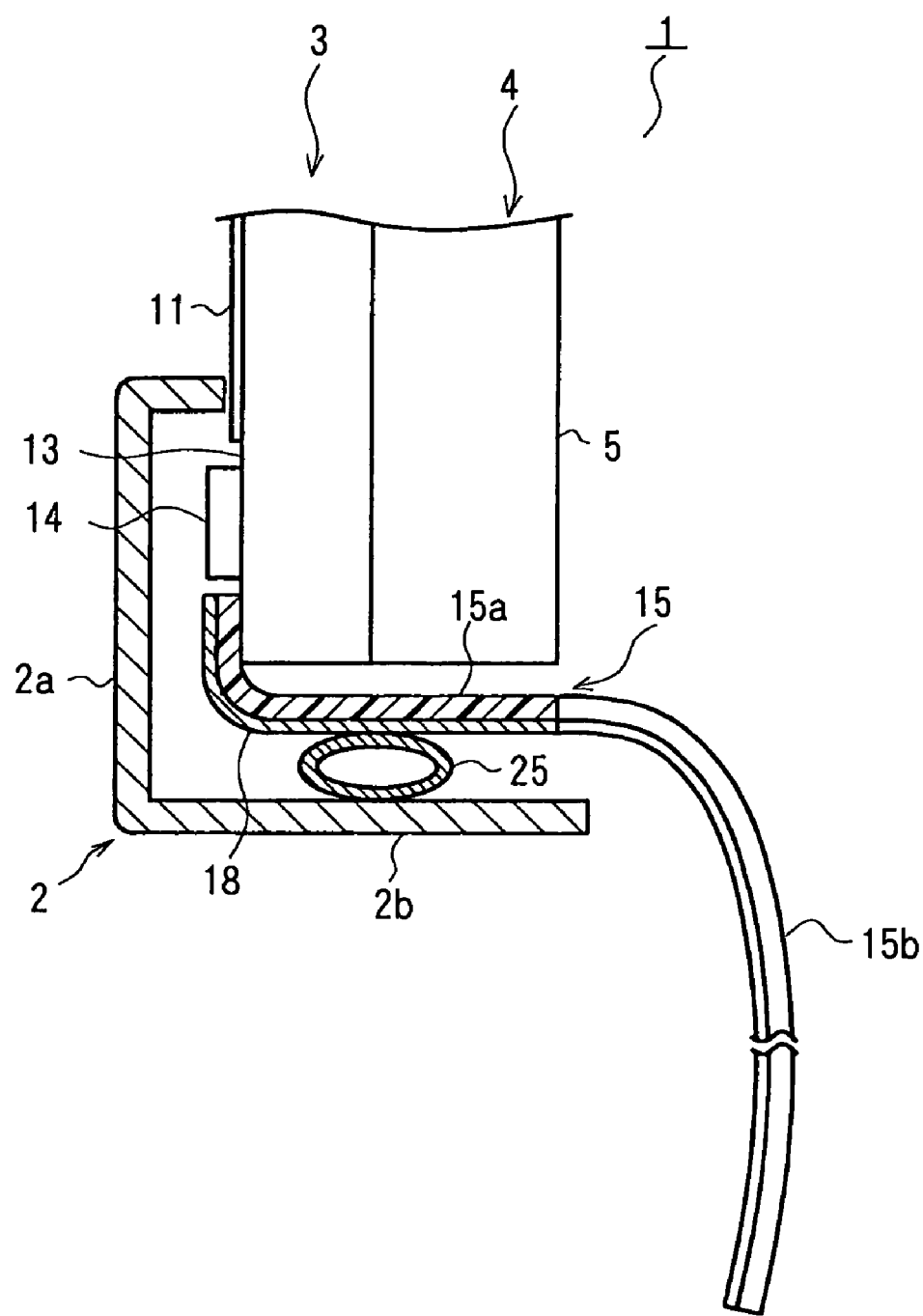
FIG. 9 is a cross sectional view of a relevant part of a display device according to the fourth embodiment of the present invention.

Referring to FIG. 9, a tube 25 is provided between the metal foil 18 and the bottom portion 2a of the external frame 2. The tube 25 is a connecting member having resilience. It is made of electrically conductive plastic and formed in a cylindrical shape.

The FPC 15 is prepared and connected with the LCD panel 3 in the same manner as the first embodiment. The tube 25 is brought into contact with the bottom portion 2b of the external frame 2 and the metal foil 18 with its resilient force. As a result, the metal foil 18 is electrically connected with the external frame 2. Since the metal foil 18 is electrically connected with the external frame 2, the radiating noises are effectively reduced as discussed in the first embodiment section.

The present invention should not be limited to the embodiment previously discussed and shown in the figures, but may be implemented in various ways without departing from the spirit of the invention. For example, the connecting flap 18c may be directly connected to the external frame 2. A flat cable may be used instead of the FPC 15. The circuit board area 13 can be prepared on a substrate other than the first glass substrate 8. Electronic components that form the display control device may be mounted in the circuit board area 13. In this case, a reference clock circuit or a power supply circuit is arranged outside the LCD device 1. Therefore, the FPC 15 is connected to the clock circuit or the power supply circuit, that is, an external device.

The circuit board area 13 can be prepared in the second glass substrate 9 or both substrates 8, 9. The circuit board area 13 may be formed in the display area and invisible tiny electronic components may be mounted in the circuit board area 13. In this case, the circuit board area 13 and the electronic components can be arranged within the glass substrate.

The shielding layer can be formed by evaporating a metal, such as silver, onto the surface of the FPC 15. A thickness of the evaporated metal is preferably between 0.001 µm and 1 µm inclusive. The shielding layer may be formed on both surfaces of the FPC 15. A flat cable can be user for the connecting member. The display panel can be an electro luminescent (EL) panel or field emission display (FED) panel.

What is claimed is:

1. A display device comprising:
   a display panel having a circuit board area in which electronic components are mounted;
   a metal external frame that houses the display panel;
   a connecting member that connects the circuit board area with an external electronic device; and
   a shielding layer that shields a noise produced in the connecting member, wherein
   the connecting member includes a flexible printed circuit board having a ground on a surface, and
   the shielding layer is electrically connected with the around of the circuit board and the external frame.

2. The display device according to claim 1, wherein:
   the display panel is constructed of two transparent plates and liquid crystal that is filled between the transparent panels;
   one of the transparent plates is a glass substrate; and
   the circuit board area is formed on the glass substrate.

3. The display device according to claim 1, wherein:
the connecting member is a flexible printed circuit board;
the flexible printed circuit board has first and second sides;
the shielding layer is bonded to at least one of the first and the second sides of the flexible printed circuit board.

4. The display device according to claim 1, wherein the shielding layer is formed with a metal foil.

5. The display device according to claim 4, wherein:
the connecting member has first and second sides;
the ground is provided on at least one of the first and second sides of the connecting member; and
the metal foil is arranged on at least one of the first and the second sides on which the ground is provided such that the metal foil has contact with the ground.

6. The display device according to claim 1, wherein the display device further comprises a connecting section through which the shielding layer is electrically connected with the external frame.

7. The display device according to claim 6, wherein the connecting section is a metal foil tape.

8. The display device according to claim 6, wherein:
the external frame has a bump portion that functions as the connecting member; and
the bump portion has contact with the shielding layer for electrically connecting the shielding layer with the external frame.

9. The display device according to claim 6, wherein:
the connecting member is an elastic tube provided by forming an electrically conductive member into a cylindrical shape;
the elastic tube is arranged between the shielding layer and the external frame for electrically connecting the shielding layer with the external frame through elasticity thereof.

10. The display device according to claim 9, wherein the elastic tube is made of an electrically conductive plastic.

11. The display device according to claim 1, wherein:
the surface of the flexible printed circuit board is covered with an insulating coating except for a land of the ground; and
the shielding layer is electrically connected to the land of the ground.

12. The display device according to claim 1, wherein the shielding layer is bonded to the connecting member to be electrically connected thereto.

13. The display device according to claim 1, further comprising an onboard device including a main body, wherein:
the main body has a display holding portion that is made of metal;
the display holding portion is connected with an external ground of the external electric device;
the external frame is fixed to the display holding portion; and
the shielding layer and the external frame are electrically connected with the display bolding portion.

14. The display device according to claim 1, wherein:
the connecting member has a substrate connecting portion connected to the circuit board area, and an external device connecting portion extending from the substrate connecting portion and connected to the external electronic device; and
the shielding layer covers at least a part of the substrate connecting portion and at least a part of the external device connecting portion.

* * * * *